US007902104B2

(12) United States Patent
Kalck et al.

(10) Patent No.: US 7,902,104 B2
(45) Date of Patent: Mar. 8, 2011

(54) DIVIDED SOLID COMPOSITION COMPOSED OF GRAINS PROVIDED WITH CONTINUOUS METAL DEPOSITION, METHOD FOR THE PRODUCTION AND USE THEREOF IN THE FORM OF A CATALYST

(75) Inventors: Philippe Kalck, Auzeville-Tolosane (FR); Philippe Serp, Toulouse (FR); Massimiliano Corrias, Toulouse (FR)

(73) Assignees: Arkema France, Colombes (FR); Institut National Polytechnique de Toulouse, Toulouse (FR)

( * ) Notice: Subject to any disclaimer, the term of this patent is extended or adjusted under 35 U.S.C. 154(b) by 699 days.

(21) Appl. No.: 11/629,063

(22) PCT Filed: Jun. 21, 2005

(86) PCT No.: PCT/FR2005/001541

§ 371 (c)(1), (2), (4) Date: Nov. 20, 2007

(87) PCT Pub. No.: WO2006/008384

PCT Pub. Date: Jan. 26, 2006

(65) Prior Publication Data

US 2008/0213154 A1 Sep. 4, 2008

(30) Foreign Application Priority Data

Jun. 23, 2004 (FR) ..................................... 04 06803

(51) Int. Cl.
*B01J 23/00* (2006.01)
*B01J 21/00* (2006.01)
*B01J 20/00* (2006.01)

(52) U.S. Cl. ............. 502/66; 502/74; 502/184; 502/185; 502/244; 502/245; 502/254; 502/255; 502/256; 502/257; 502/258; 502/259; 502/260; 502/261; 502/262; 502/263; 502/308; 502/309; 502/313; 502/314; 502/315; 502/316; 502/326; 502/327; 502/328; 502/332; 502/333; 502/334; 502/335; 502/336; 502/337; 502/338; 502/339; 502/340; 502/345; 502/346; 502/349; 502/350; 502/351; 502/355; 502/415; 502/439

(58) Field of Classification Search .................... 502/66, 502/74, 184, 185, 244, 245, 254, 255, 256, 502/257, 258, 259, 260, 261, 262, 263, 308, 502/309, 313, 314, 315, 316, 326, 327, 328, 502/332, 333, 334, 335, 336, 337, 338, 339, 502/340, 345, 346, 349, 350, 351, 355, 415, 502/439

See application file for complete search history.

(56) References Cited

U.S. PATENT DOCUMENTS 2,885,366 A * 5/1959 Iler ................................ 516/90
2,930,767 A * 3/1960 Novak .......................... 502/100
3,207,700 A * 9/1965 Saffer .......................... 502/178
3,228,848 A * 1/1966 Fellows ........................ 376/323
3,511,683 A * 5/1970 Heilwell et al. .............. 427/216
5,217,804 A * 6/1993 James et al. .................. 428/329
5,284,617 A * 2/1994 Tiwari et al. .................... 420/33
5,500,200 A 3/1996 Mandeville et al.
5,976,490 A * 11/1999 Wendelbo ..................... 423/712
6,423,288 B2 7/2002 Mandeville et al.
6,592,842 B2 * 7/2003 Elder et al. .................... 423/610
6,685,909 B2 * 2/2004 Elder et al. .................... 423/598
7,052,777 B2 * 5/2006 Brotzman et al. ............ 428/570
7,157,402 B2 * 1/2007 Yu et al. ........................ 502/185
7,541,017 B2 * 6/2009 Bringley et al. ............. 424/1.29
7,549,427 B2 * 6/2009 Dellinger et al. ............ 131/342
2004/0234445 A1 11/2004 Serp et al.
2005/0075240 A1 * 4/2005 Yamamoto .................... 502/101
2005/0186337 A1 * 8/2005 Bringley et al. .............. 427/220
2006/0067868 A1 * 3/2006 Kutsovsky .................... 423/335
2006/0204420 A1 * 9/2006 Vaarkamp et al. ............ 423/247
2006/0293396 A1 * 12/2006 Bringley et al. .............. 516/100

FOREIGN PATENT DOCUMENTS

FR 2707526 7/1993

* cited by examiner

*Primary Examiner* — Cam N Nguyen
(74) *Attorney, Agent, or Firm* — Steven D. Boyd

(57) ABSTRACT

This invention relates to a solid divided composition comprising grains whose mean size is greater than 25 μm and less than 2.5 mm, wherein each grain is provided with a solid porous core and a homogeneous continuous metal layer consisting of at least one type of transition non-oxidised metal and extending along a gangue coating the core in such a way that pores are inaccessible. A method for the production of said composition and for the use thereof in the form of a solid catalyst is also disclosed.

16 Claims, No Drawings

DIVIDED SOLID COMPOSITION COMPOSED OF GRAINS PROVIDED WITH CONTINUOUS METAL DEPOSITION, METHOD FOR THE PRODUCTION AND USE THEREOF IN THE FORM OF A CATALYST

FIELD OF THE INVENTION

The invention relates to a divided solid composition formed from particles with a mean particle size ($D_{50}$) of greater than 25 μm and less than 2.5 mm, having at least one transition metal on the surface. The invention also relates to its manufacturing process, and to its use as catalyst.

BACKGROUND OF THE INVENTION

Divided solid compositions formed from particles having at least one transition metal in the unoxidized state on the surface may serve in particular as a catalyst in many chemical reactions.

In the field of dispersed supported metal catalysts, it is known that the catalytic activity of catalysts is better the smaller the size of the metal particles or clusters and the greater the dispersion on the support grains (cf. for example FR-2707526, U.S. Pat. Nos. 5,500,200, 6,423,288, WO-03002456, etc.).

In the case of unoxidized metals used in particular for catalyzing the formation of carbon nanotubes by thermal decomposition in the gas phase of a carbon source, it is considered necessary to provide a multiplicity of discontinuous metal catalytic sites dispersed over grains of a support, the size of the dispersed metal sites corresponding to the diameter of the nanotubes to be formed. Very extensive research has been carried out in this regard. Another solution would be to use catalyst particles with a size equivalent to the diameter of the nanotubes to be formed since a metal grain or particle is driven to the end of each nanotube.

Now, in complete contradiction with this teaching, and in a completely surprising and hitherto unexplained manner, the inventors have demonstrated that a coating of at least one continuous unoxidized metal of large size in the form of a shell around a porous core gives unexpected properties, especially as a solid catalyst, in particular in dehydrogenation and/or thermal decomposition reactions in the gas phase, and more particularly for the selective formation of silicon and/or carbon and/or boron and/or nitrogen nanoparticles, especially carbon nanotubes from a gaseous carbon source.

The invention therefore relates to a divided solid composition comprising particles with a mean particle size greater than 25 μm and less than 2.5 mm, each particle having:

- a core of a mesoporous and/or microporous solid material; and
- a homogeneous continuous metal shell of at least one unoxidized transition metal, chosen from iron, cobalt, nickel, molybdenum, copper, tungsten, chromium, ruthenium, palladium and platinum, covering the core in such a way that the mesopores and/or the micropores of the core are rendered inaccessible.

By "continuous" shell or layer is meant that it is possible to pass continuously over the entire surface of this shell or layer without having to pass through a portion of another nature (especially a portion not coated with unoxidized metal). Thus, in a composition according to the invention, the metal(s) is(are) not dispersed over the surface of each particle but, on the contrary, forms(form) a continuous layer with an apparent surface area corresponding substantially to that of the particles. This layer is also "homogeneous" in the sense that it is formed from at least one pure metal having a solid composition that is identical throughout its volume. This layer covers the entire surface of the core and thus forms a shell.

The inventors have found, extremely surprisingly and hitherto inexplicably, that such a composition according to the invention provides, especially as catalyst, effects that are completely different from those obtained with a similar composition in which the core of the particles is not porous even though this core is normally not accessible from the outside, and especially not accessible to the reactants, and that the specific surface area of the composition according to the invention is very different from that which would be obtained if the pores of the core were accessible.

Advantageously, and according to the invention, the metal shell forms part of an elemental metal coating (that is to say one in which one or more metals are deposited in the elemental state, i.e. in atomic or ionic form) deposited in a single step on a solid support. Such an elemental metal coating deposited in a single step may result in particular from a vacuum evaporation deposition (PVD) operation or a chemical vapor deposition (CVD) operation or an electroplating operation.

However, such an elemental metal coating cannot result from a process carried out in several steps in liquid phase, especially by precipitation or impregnation, or by deposition in the molten state and solidification, or by deposition of one or more metal oxides followed by a reduction step. A composition according to the invention is distinguished in particular from a composition obtained by milling pieces of pure metal manufactured metallurgically.

An elemental metal coating deposited in a single step is formed from crystalline microdomains of the metal(s). Such an elemental metal coating is formed from mutually agglutinated metal bulbs (rounded globules).

In one composition according to the invention, the metal shell forms the external surface of the particles, immediately after its manufacture and if the composition is not brought into contact with an oxidizing medium. If the composition brought is brought into contact with the atmospheric air, an oxide layer may form on the periphery. This oxide layer may if necessary be removed by a reduction step.

Advantageously, and according to the invention, the metal shell covers the surface of the macroscopic form (surface envelope considered without taking the porosity into account) of the particles, which is itself a closed surface. The metal shell therefore extends over a closed surface around the porous core. The expression "closed surface" is used in the topological sense of the term, that is to say it denotes a surface that delimits and surrounds a finite internal space, which is the core of the grain, and can adopt various shapes (sphere, polyhedron, prism, torus, cylinder, cone, etc.). The shape of each particle depends on that of the solid material core and on the conditions under which the elemental metal coating constituting the metal shell is formed on this core.

It should be noted that the fact that these pores are made inaccessible by the metal shell can be easily verified by a simple measurement of the change in specific surface area due to the presence of the metal shell and/or by calculating the volume of residual mesopores and/or micropores and/or by XPS analysis, making it possible to demonstrate that the constituent chemical elements of the core are no longer accessible on the surface. Thus, in particular, the composition according to the invention has a specific surface area corresponding to that of the particles, the pores of which are inaccessible.

Advantageously, and according to the invention, the core is formed from a porous material chosen from alumina, activated carbon, silica, a silicate, magnesia, titanium oxide, zirconia and a zeolite. In particular, the core is formed from a material other than an unoxidized transition metal. Furthermore, advantageously and according to the invention, the metal layer of each particle has a mean apparent surface area (i.e. the area of its envelope surface, ignoring any porosity thereof) of greater than $2\times10^3$ μm$^2$. More particularly, advantageously and according to the invention, the metal shell of each particle has a mean apparent surface area of between $10^4$ μm$^2$ and $1.5\times10^5$ μm$^2$.

Furthermore, advantageously and according to the invention, the metal shell of each particle extends superficially with a developed overall mean dimension of greater than 35 μm. The developed overall mean dimension is the equivalent radius of the disk circumscribing the metal shell after it has been virtually developed in a plane. Advantageously, and according to the invention, the metal shell of each particle extends superficially with a developed overall mean dimension of between 200 μm and 400 μm. The metal bulbs formed by the elemental metal deposition and forming the metal shell have a mean dimension between 10 nm and 1 μm, especially between 30 nm and 200 nm.

Advantageously, and according to the invention, the shape and the dimension of the particles are adapted so as to allow the formation of a fluidized bed of the particles of a composition according to the invention. A composition according to the invention is advantageously applicable for forming a fluidized bed, especially as a supported metal catalyst.

More particularly, advantageously and according to the invention, the composition has a mean particle size ($D_{50}$) of between 100 μm and 200 μm. The macroscopic shape of the particles may or may not be substantially spherical overall. The invention also applies to particles of somewhat flattened macroscopic shape (flakes, disks, etc.) and/or of elongate macroscopic shape (cylinders, rods, ribbons, etc.).

Advantageously, and according to the invention, the solid core is formed from a porous material with a specific surface area of greater than 100 m$^2$/g. However, the solid composition according to the invention has a specific surface area of less than 25 m$^2$/g.

It should be noted that the thickness of the elemental metal coating extends at least partly as an overthickness relative to the porous core in order to form said metal layer. The metal coating may extend, also at least partly, into the thickness of the porous core. However, it is not always easy for the interface between the solid porous core, impregnated with the metal coating, and the metal shell extending away from the porous core, and their relative disposition to be precisely and clearly determined.

Advantageously, and according to the invention, the elemental metal coating (which comprises said homogeneous continuous metal shell and that part of the porous core which is impregnated with metal(s)) extends over a thickness of greater than 0.5 μm, especially around 2 to 20 μm.

More particularly, advantageously and according to the invention, the metal shell comprises at least one metal chosen from iron, cobalt, nickel, molybdenum, copper, tungsten, chromium, ruthenium, palladium and platinum, or a mixture of such metals. In particular, the metal shell is different from a tantalum shell. Advantageously, the composition according to the invention is formed from porous alumina particles covered with a shell formed by a metal coating consisting mainly of iron. In one particularly advantageous embodiment, the invention relates to a composition characterizes in that the metal shell is an iron layer.

Furthermore, advantageously and according to the invention, the composition comprises more than 35% by weight of metal(s).

The composition according to the invention is advantageously formed mainly from such particles, that is to say it contains more than 50% of such particles, preferably more than 90% Of such particles.

Moreover, advantageously and according to the invention, the composition has a unimodal particle size distribution and the equivalent diameter of the particles is between 80% and 120% of the mean diameter of the particles of the composition.

The invention also relates to a composition formed exclusively, apart from impurities, from such particles, that is to say the particles of which are all in accordance with all or some of the features of the invention defined above or below.

The invention also relates to a process for manufacturing a composition according to the invention.

It also relates to a process for manufacturing a divided solid composition formed from particles with a mean particle size of greater than 25 μm and less than 2.5 mm, each having a core of solid material and, on the surface, at least one unoxidized transition metal, in which process a metal coating is deposited, in a nonoxidizing medium, on grains of a solid support forming the core of each particle, characterized in that said metal coating is deposited in the form of an elemental metal coating consisting of at least one nonoxidized transition metal chosen from iron, cobalt, nickel, molybdenum, copper, tungsten, chromium, ruthenium, palladium and platinum on a support of mesoporous and/or microporous solid material for a time suitable for this coating to form, on each mesoporous and/or microporous solid core, a homogeneous continuous metal shell covering the core of each particle in such a way that the mesopores and/or micropores of the core are made inaccessible.

Advantageously, and according to the invention, the metal coating is deposited in the form of an elemental metal coating (i.e. one in which one or more metals are deposited in the elemental state, i.e. in atomic or ionic form) in a single step in a fluidized bed of the solid support grains, said bed being supplied with at least one precursor in a gas phase that is capable of forming said metal coating. Such a process may be carried out by vacuum evaporation, by deposition in a gas phase, or by electroplating.

Advantageously, and according to the invention, said metal coating is deposited by chemical vapor deposition.

Advantageously, and according to the invention, said metal coating is deposited using at least one organometallic precursor.

Advantageously, and according to the invention, at least one precursor is chosen from [$Fe(CO)_5$] (iron pentacarbonyl), [$Fe(Cp)_2$] (ferrocene or bis(cyclopean-tadienyliron), [Fe $(acac)_3$] (iron triacetylacetonate), [$Mo(CO)_6$] (molybdenum hexacarbonyl), [$Mo(C_5H_5)$ $(CO)_3]_2$ (cyclopentadienyltricarbonylmolybdenum dimer), [$Mo(allyl)_4$] (tetraallylmolybdenum), [$W(CO)_6$] (tungsten hexacarbonyl), [$W(C_6H_6)_2$] (bis (benzene)tungsten), [$W(But)_3$] (tributyl-tungsten), [W $(allyl)_4$] (tetraallyltungsten), [$Ni(CO)_4$] (nickel tetracarbonyl), [$Ni(Cp)_2$] (nickelocene or bis(cyclopentadienyl)nickel), [$Ni(CH_3C_5H_4)_2$] (bis(methyl-cyclopentadienyl)nickel), [Cr $(CO)_6$] (chromium hexa-carbonyl), [$Cr(C_5H_5)$ $(CO)_3]_2$ (cyclopentadienyltricarbonyl-chromium dimer), [$C_6H_6Cr$ $(CO)_3$)] (phenyltricarbonyl-chromium), [$Cr(C_6H_6)_2$] (bis (benzene)chromium), [$Cu(acac)_2$] (copper diacetylacetonate), [$Cu(hfacac)_2$] (bis(hexafluoro-acetylacetonate)copper), [$Co_2(CO)_8$] (dicobalt octacarbo-nyl), [Pd(allyl)Cp] (allyl cyclopentadienylpalladium), [$Pt(CH_3)_2(COD)$] (dimethyl cyclooctadiene platinum), $[Ru(CO)_5]$ (ruthenium pentacarbonyl) and $[RuCp_2]$ (ruthenocene).

Each precursor in the vapor state may be continuously diluted in a gas mixture that is continuously delivered into a reactor containing the solid support grains, under conditions suitable for ensuring fluidization of the support grains and atomic metal deposition on the grains.

Advantageously, and according to the invention, the metal coating is deposited so as to obtain a composition as defined above. In particular, the solid support, the precursor(s) and the deposition time are chosen so as to obtain the abovementioned geometrical characteristics.

The invention also relates to a composition obtained by a process according to the invention as defined above.

The invention relates to the use of a composition according to the invention as solid catalyst. The invention also relates to a process for carrying out a chemical reaction in the presence of at least one solid catalyst, characterized in that at least one composition according to the invention is used as solid catalyst.

A composition according to the invention may advantageously be used in any chemical reaction as heterogeneous solid catalyst, and in particular within the context of gas phase thermal decomposition reactions. Nevertheless, advantageously and according to the invention, the reaction is a dehydrogenation reaction using at least one fluid reactant.

More particularly, the invention relates to a process for manufacturing nanoparticles of a material chosen from silicon, carbon, boron, nitrogen and a mixture of these elements, characterized in that at least one composition according to the invention is used as solid catalyst.

Advantageously, and according to the invention, the reaction is a reaction for the selective manufacture of carbon nanotubes by thermal decomposition of a gaseous carbon source. Thus, the invention relates more particularly to a process for the selective manufacture of carbon nanotubes by decomposition of a carbon source in the gaseous state brought into contact with at least one supported solid catalyst in the form of particles, called catalyst particles, characterized in that at least one composition according to the invention (having all or some of the abovementioned features) is used as solid catalyst.

The invention also relates to a composition, to a manufacturing process and to a chemical reaction process that are characterized, in combination, by all or some of the features mentioned above or below.

Other objects, features and advantages of the invention will become apparent on reading the following description of its embodiments.

An installation for the implementation of a process for manufacturing a divided solid catalytic composition according to the invention comprises a reactor, called a deposition reactor, for synthesizing the catalytic composition by chemical vapor deposition (CVD), which includes a glass sublimator into which the organometallic precursor is introduced. This sublimator comprises a sintered plate and can be heated to the desired temperature by a heated bath.

The inert carrier gas, for example helium, which entrains the vapor of the organometallic precursor used, is stored in a bottle and admitted into the sublimator via a flow regulator.

The sublimator is connected to a lower gas compartment, which comprises a sintered plate, into which compartment water vapor is introduced, which serves to activate the decomposition of the organometallic precursor. The presence of water makes it possible to obtain an unoxidized metal coating (thanks to the gas-to-water displacement reaction) containing no impurities, and thus a highly active catalyst. The compartment has a jacket thermostatted to a temperature that can be adjusted my means of a temperature regulator. The water vapor is entrained my and with an inert carrier gas, for example nitrogen, stored in a bottle and admitted into the compartment via a flow regulator. A supply of inert carrier gas, for example nitrogen, is intended to adjust the flow rates so as to obtain the fluidization conditions. This carrier gas is stored in a bottle and admitted into the compartment via a flow regulator.

The top of the compartment is connected in a sealed manner to a glass fluidization column, for example 5 cm in diameter, which is provided at its base with a gas distributor. This jacketed column is thermostatted at a temperature which may be adjusted by means of a temperature regulator.

The top of the column is connected to a vacuum pump via a trap, in order to retain the decomposition gases released.

The operating protocol for the embodiments relating to the production of the catalysts according to the invention by CVD is the following.

A mass $M_p$ of precursor is introduced into the sublimator.

A mass $M_g$ of support grains is poured into the column and a quantity (for example around 20 g) of water is introduced into the compartment using a syringe. A vacuum is created in the assembly formed by the compartment and the column. The temperature of the bed is brought to $T_1$.

The sublimator is brought to the temperature $T_s$ and the pressure is set to the value $P_a$ throughout the apparatus by introducing the carrier gases (total flow rate Q). The deposition then starts and lasts for a time $t_d$.

At the end of deposition, the temperature is brought back down to room temperature by slow cooling, and the vacuum pump is stopped. Once the system has returned to room temperature and atmospheric pressure, the catalytic granular composition is removed from the column 7 under an inert gas atmosphere (for example a nitrogen atmosphere). The composition is ready to be used, for example for manufacturing nanotubes in a growth reactor.

The growth reactor consists of a quartz fluidization column (for example 2.6 cm in diameter) provided in the middle of it with a distributing plate (made of quartz frit) on which the powder of catalytic granular composition is placed. The column may be brought to the desired temperature using an external oven, which may slide vertically along the fluidization column. In the protocol used, this oven has either a high position, where it does not heat the fluidized bed, or a low position where it heats the bed. The gases (inert gas such as helium, carbon source and hydrogen) are stored in bottles and admitted into the fluidization column via flow regulators.

At the top, the fluidization column is connected in a sealed manner to a trap designed to collect any fines of the catalytic granular composition or a catalytic granular composition/nanotube mixture.

The height of the column is adapted so as to contain, in operation, the fluidized bed of catalyst particles. In particular, it is at least equal to 10 to 20 times the gas height, and must correspond to the heated zone. In the embodiments, a column having a total height of 70 cm, heated over a height of 60 cm by the oven, is chosen.

The operating protocol for the embodiments relating to the manufacture of nanotubes according to the invention is the following:

A mass $M_c$ of catalyst (a catalytic granular composition according to the invention) is introduced into the fluidization column with an atmosphere of inert gas.

When the oven is in the low position relative to the catalyst bed, its temperature is brought to the desired temperature $T_n$ for synthesizing the nanotubes, either in an inert gas atmosphere or in an inert gas/hydrogen (reactive gas) mixture.

When this temperature is reached, the carbon source, the hydrogen and an addition of inert gas are introduced into the column. The total flow rate $Q_T$ ensures that the bed is in a bubbling regime at the temperature $T_n$, without expulsion.

The growth of the nanotubes then starts, and lasts for a time $t_n$.

After the growth, the oven is placed in the high position relative to the catalyst bed, the flows of gases corresponding to the carbon source and hydrogen are stopped, and the temperature is brought back down to room temperature by slow cooling.

The carbon nanotubes associated with the metal particles and attached to the support grains are extracted from the growth reactor and stored without taking any particular precaution.

The quantity of carbon deposited is measured by weighing and by thermogravimetric analysis.

The nanotubes thus manufactured are analyzed by transmission electron microscopy (TEM) and scanning electron microscopy (SEM) for the size and dispersion measurements and by X-ray crystallography and Raman spectroscopy for evaluating the crystallinity of the nanotubes.

EXAMPLES

Example 1

A catalyst composition containing 40 wt % $Fe/Al_2O_3$ was prepared by the fluidized-bed CVD technique described above. The carrier gas was nitrogen. The organometallic precursor was iron pentacarbonyl and the support was mesoporous γ-alumina (pore volume: 0.54 $cm^3/g$) that had been screened between 120 μm and 150 μm and had a specific surface area of 160 $m^2/g$.

The operating conditions were the following:

$M_g$=25 g;
$M_p$=58.5 g;
$T_1$=220° C.;
$P_a$=40 torr;
$T_s$=35° C.;
Q=250 $cm^3$/min;
$t_d$=200 min.

The composition obtained was formed from alumina particles completely covered with an iron shell consisting of a mass of iron bulbs measuring from 30 nm to 300 nm (FIGS. 4 and 5). The specific surface area (measured using the BET method) of the final material was 8 $m^2/g$ and the XPS analyses showed that aluminum was no longer present nor accessible on the surface.

Example 2

The purpose of this example is to prepare a composition according to the invention containing 75 wt % iron on mesoporous $Al_2O_3$ as indicated in example 1, but with the following operating conditions:

$M_g$=25 g;
$M_p$=263 g;
$T_1$=220° C.;
$P_a$=40 torr;
$T_1$=35° C.;
Q=150 $cm^3$/min;
$t_d$=350 min.

The composition obtained was formed from alumina particles completely covered with an unoxidized iron shell. The XPS analyses showed that aluminum was no longer present nor accessible on the surface.

Example 3

The purpose of this example was to prepare a composition according to the invention containing 51.5 wt % iron on silica ($SiO_2$) by fluidized-bed CVD as indicated above. The organometallic precursor used for depositing the iron was iron pentacarbonyl [$Fe(CO)_5$], the support was mesoporous silica (pore volume: 1.8 $cm^3/g$) that had undergone screening so as to have particles with sizes ranging between 80 μm and 120 μm and having a specific surface area (BET method) of 320 $m^2/g$. The carrier gas was nitrogen.

The operating conditions were the following:

$M_g$=50 g;
$M_p$=52 g;
$T_1$=220° C.;
$P_a$=40 torr;
$T_s$=35° C.;
Q=150 $cm^3$/min;
$t_d$=190 min.

The composition obtained was formed from silica particles completely covered with an iron shell. The specific surface area (BET method) of the final material was 24.1 $m^2/g$ and the XPS analyses showed that silicon was no longer present on the surface.

Example 4

The purpose of this example was to prepare a composition according to the invention containing 65.3 wt % iron on mesoporous $SiO_2$ as indicated in example 4, but with $t_d$=235 min.

The composition obtained was formed from silica particles completely covered with an iron shell. The specific surface area (BET method) of the final material was 1.8 $m^2/g$ and the XPS analyses showed that silicon was no longer present on the surface.

Example 5

Multiwalled carbon nanotubes were manufactured from the 40% $Fe/Al_2O_3$ catalyst of example 1 using gaseous ethylene as carbon source.

The operating conditions were the following:

$M_c$=0.100 g;
$T_n$=650° C.;
$Q(H_2)$=100 $cm^3$/min;
$Q(C_2H_4)$=200 $cm^3$/min;
Z=300;
for $t_n$=120 min: A=15.6 and P=30.3;
for $t_n$=240 min: A=9.9 and P=39.6.

In all cases, the multiwalled-nanotube selectivity was close to 100%.

What was thus obtained was both a high catalytic activity A (expressed in grams of nanotubes produced per gram of catalytic composition and per hour), of the order of or greater than 10, and, simultaneously, also a high productivity P (expressed in grams of nanotubes produced per gram of catalytic composition), of the order of or greater than 25, and to do so with a nanotube selectivity close to 100%.

The result is extremely surprising in so far as, with all known catalysts, either a good activity is obtained to the detriment of a low productivity (the case for catalysts having a low proportion of metal on the support) or, on the contrary, a high productivity to the detriment of a low activity (the case for catalysts having a high proportion of metal). Now, these parameters are both important in the context of an industrial production line. The productivity associated with the selectivity makes it possible to dispense with the subsequent purification steps. A high activity allows the reaction time to be minimized.

The diameter of the nanotubes obtained is predominantly around 10 nm to 25 nm, whereas the particles of the composition had a diameter of around 150 μm. Here again, this result is surprising and inexplicable, going counter to all the prior teaching.

Comparative Example 6

A catalyst composition comprising 20 wt % $Fe/Al_2O_3$ was prepared by the fluidized-bed CVD technique described above. The carrier gas was nitrogen. The organometallic precursor was iron pentacarbonyl and the support was nonporous a-alumina (specific surface area (BET method): 2 $m^2$/g).

The operating conditions were the following:

$M_g$=50 g;
$M_p$=14 g;
$T_1$=220° C.;
$P_a$=40 torr;
$T_s$=35° C.;
Q=250 $cm^3$/min;
$t_d$=15 min.

The composition obtained was formed from alumina particles covered with a shell formed from a mass of iron bulbs entirely covering the surface of the alumina with a surface composition in which aluminum was absent, as measured by XPS analysis.

Multiwalled carbon nanotubes were manufactured using this iron/nonporous alumina catalyst using gaseous ethylene as carbon source.

The operating conditions were the following:

$M_c$=0.100 g;
$T_n$=650° C.;
$Q(H_2)$=100 $cm^3$/min;
$Q(C_2H_4)$=200 $cm^3$/min;
Z=500;
for $t_n$=60 min: A=0.9 and P=0.2.

These results are 30 times inferior than those obtained with a catalyst according to the invention (example 1) under the same operating conditions. In addition, the selectivity obtained, as evaluated by transmission electron microscopy and thermogravimetric analysis, was poor.

These results cannot be explained, in so far as the difference between the two catalytic compositions lies in the porous or nonporous nature of the core, which is not accessible on the surface owing to the metal shell.

The invention is capable of many alternative embodiments and applications other than those of the abovementioned examples.

In particular, the invention may be used to manufacture nanoparticles other than carbon nanotubes. Thus, N—B—C, Si—C, Si—C—N and C—N nanotubes may be produced by catalytic CVD using supported metal catalysts (cf. in particular: L. Shi, L. Chen, Z. Yang, J. Ma and Y. Qian, Carbon (2005), 43, 195; M. Glerup, M. Castignolles, M. Holzinger, G. Hug, A. Loiseau and P. Bernier, Chem. Commun. (2003), 2452; H. L. Chang, C. H. Lin and C. T. Kuo, Diamond and Related Materials, (2002), 11, 793; and R. Larciprete, S. Lizzit, C. Cepek, S. Botti and A. Goldoni, Surface Science (2003), 532, 886). Consequently, such nanotubes may also be produced with a catalytic composition according to the invention.

Other supports and other metals may be used. The metals may be deposited by processes other than CVD, for example by vacuum evaporation or another gas phase deposition, or by electroplating.

A composition according to the invention may be used for other purposes, especially as a supported catalyst for other chemical reactions (for example the thermal degradation of pollutant organic gases).

The invention claimed is:

1. A divided solid composition comprising particles having a mean particle size greater than 25 μm and less than 2.5 mm, each particle having:

a core of a mesoporous and/or microporous solid material; and a homogeneous continuous metal shell of at least one unoxidized transition metal, chosen from the group consisting of iron, cobalt, nickel, molybdenum, copper, tungsten, chromium, ruthenium, palladium and platinum, covering the core in such a way that the mesopores and/or the micropores of the core are rendered inaccessible.

2. The composition as claimed in claim 1, wherein the core is formed from a porous material chosen from the group consisting of alumina, activated carbon, silica, a silicate, magnesia, titanium oxide, zirconia and a zeolite.

3. The composition as claimed in claim 1, wherein the core is a porous material having a specific surface area of greater than 100 $m^2$/g and said composition has a specific surface area of less than 25 $m^2$/g.

4. The composition as claimed in claim 1, wherein the metal shell forms part of an elemental metal coating deposited in a single step on a solid support forming the porous core.

5. The composition as claimed in claim 4, wherein the elemental metal coating extends over a thickness of greater than 0.5 μm.

6. The composition as claimed in claim 4, wherein the elemental metal coating extends over a thickness of around 2 to 20 μm.

7. The composition as claimed in claim 1, wherein the metal shell of each particle has a mean apparent surface area of greater than $2\times10^3$ $\mu m^2$.

8. The composition as claimed in claim 1, wherein the metal shell of each particle has a mean apparent surface area of between $10^4$ $\mu m^2$ and $1.5\times10^5$ $\mu m^2$.

9. The composition as claimed in claim 1, wherein it has a mean particle size of between 100 μm and 200 μm.

10. The composition as claimed in claim 1, wherein the metal shell of each particle extends superficially with a developed overall mean dimension of greater than 35 μm.

11. The composition as claimed in claim 10, wherein t the metal shell of each particle extends superficially with a developed overall mean dimension of between 200 μm and 400 μm.

12. The composition as claimed in claim 1, wherein the metal shell comprises at least one metal chosen from the group consisting of iron, cobalt, nickel, molybdenum, copper, tungsten, chromium, ruthenium, palladium and platinum.

13. The composition as claimed in claim 1, wherein it is formed from porous alumina particles covered with a shell formed by a metal coating consisting mainly of iron.

14. The composition as claimed in claim 1, wherein the metal shell is an iron layer.

15. The composition as claimed in claim 1, wherein it comprises more than 35% by weight of metal(s).

16. The composition as claimed in claim 1, wherein it has a unimodal particle size distribution and the equivalent diameter of the particles is between 80% and 120% of the mean diameter of the particles of the composition.

* * * * *